United States Patent
Lyders et al.

(10) Patent No.: US 10,294,817 B2
(45) Date of Patent: May 21, 2019

(54) METHOD TO INTEGRATE MULTIPLE ELECTRIC CIRCUITS INTO ORGANIC MATRIX COMPOSITE

(71) Applicant: UNITED TECHNOLOGIES CORPORATION, Hartord, CT (US)

(72) Inventors: David R. Lyders, Middletown, CT (US); Marc E. Holyfiield, Cromwell, CT (US); Kevin M. Bell, Higganum, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 411 days.

(21) Appl. No.: 15/027,752

(22) PCT Filed: Oct. 21, 2014

(86) PCT No.: PCT/US2014/061447
§ 371 (c)(1),
(2) Date: Apr. 7, 2016

(87) PCT Pub. No.: WO2015/076960
PCT Pub. Date: May 28, 2015

(65) Prior Publication Data
US 2016/0245113 A1    Aug. 25, 2016

Related U.S. Application Data

(60) Provisional application No. 61/906,960, filed on Nov. 21, 2013.

(51) Int. Cl.
*F01D 25/02* (2006.01)
*H05B 3/00* (2006.01)
(Continued)

(52) U.S. Cl.
CPC .............. *F01D 25/02* (2013.01); *B29C 70/48* (2013.01); *B29C 70/882* (2013.01); *F02C 7/047* (2013.01);
(Continued)

(58) Field of Classification Search
CPC ......... F01D 25/02; H05B 3/0014; H05B 3/42; F02K 3/02; H05K 1/0212; H05K 1/0296;
(Continued)

(56) References Cited

U.S. PATENT DOCUMENTS

| 5,316,803 A | 5/1994 | White, Jr. et al. |
| 6,334,617 B1 | 1/2002 | Putnam et al. |

(Continued)

FOREIGN PATENT DOCUMENTS

| DE | 102007062918 | * | 6/2009 |
| DE | 102007062918 A1 | | 6/2009 |
| EP | 0718929 A2 | | 6/1996 |

OTHER PUBLICATIONS

Anonymous: "Leiterplatte—Wikipedia," Oct. 10, 2013.
(Continued)

*Primary Examiner* — Shawntina Fuqua
(74) *Attorney, Agent, or Firm* — Carlson, Gaskey & Olds, P.C.

(57) ABSTRACT

A method of forming a circuit in a composite component includes providing a plurality of preform modules comprised of an organic matrix composite material, applying at least one electrical circuit on at least first and second preform modules of the plurality of preform modules, and arranging the first and second preform modules such that the electrical circuit of the first preform module is in contact with the electrical circuit of the second preform module. An additional step includes molding the first and second preform modules together to form a one-piece molded compo-
(Continued)

nent such that the electrical circuits of the first and second preform modules form a complete circuit.

22 Claims, 3 Drawing Sheets

(51) Int. Cl.
| | |
|---|---|
| F02C 7/047 | (2006.01) |
| B29C 70/48 | (2006.01) |
| B29C 70/88 | (2006.01) |
| F02K 3/02 | (2006.01) |
| H05B 3/42 | (2006.01) |
| H05K 1/02 | (2006.01) |
| H05K 3/00 | (2006.01) |

(52) U.S. Cl.
CPC ............. *F02K 3/02* (2013.01); *H05B 3/0014* (2013.01); *H05B 3/42* (2013.01); *H05K 1/0212* (2013.01); *H05K 1/0296* (2013.01); *H05K 3/0014* (2013.01); *F05D 2220/36* (2013.01); *F05D 2260/20* (2013.01); *F05D 2300/40* (2013.01); *F05D 2300/603* (2013.01); *Y02T 50/672* (2013.01)

(58) Field of Classification Search
CPC ........... B29C 7/882; B29C 7/48; B29C 7/047; F05D 2260/20; F05D 2220/36; F05D 2300/40; F05D 2300/603; Y02T 50/672
See application file for complete search history.

(56) References Cited

U.S. PATENT DOCUMENTS

| | | |
|---|---|---|
| 6,881,036 B2 | 4/2005 | Hornick et al. |
| 8,006,934 B2 | 8/2011 | Alexander et al. |
| 8,317,524 B2 | 11/2012 | Bailey |
| 8,334,486 B2 | 12/2012 | Hogate |
| 8,366,047 B2 | 2/2013 | Euvino, Jr. et al. |
| 2002/0004352 A1 | 1/2002 | Haas et al. |
| 2006/0093847 A1 | 5/2006 | Hornick |
| 2008/0073778 A1 | 3/2008 | Edwards |
| 2008/0156790 A1 | 7/2008 | Vontell |
| 2008/0173991 A1 | 7/2008 | Cruz |
| 2009/0120101 A1 | 5/2009 | Lomasney et al. |
| 2009/0260341 A1 | 10/2009 | Hogate et al. |
| 2010/0108661 A1 | 5/2010 | Vontell et al. |
| 2010/0170887 A1 | 7/2010 | Alexander et al. |
| 2012/0273263 A1 | 11/2012 | Nagarajan et al. |
| 2013/0154086 A1 | 6/2013 | Yu et al. |

OTHER PUBLICATIONS

Supplementary European Search Report for European Application No. 14863876.0 dated Jun. 16, 2017.
International Preliminary Report on Patentability for International Application No. PCT/US2014/061447 dated Jun. 2, 2016.
International Search Report from corresponding PCT/US14/61447.

\* cited by examiner

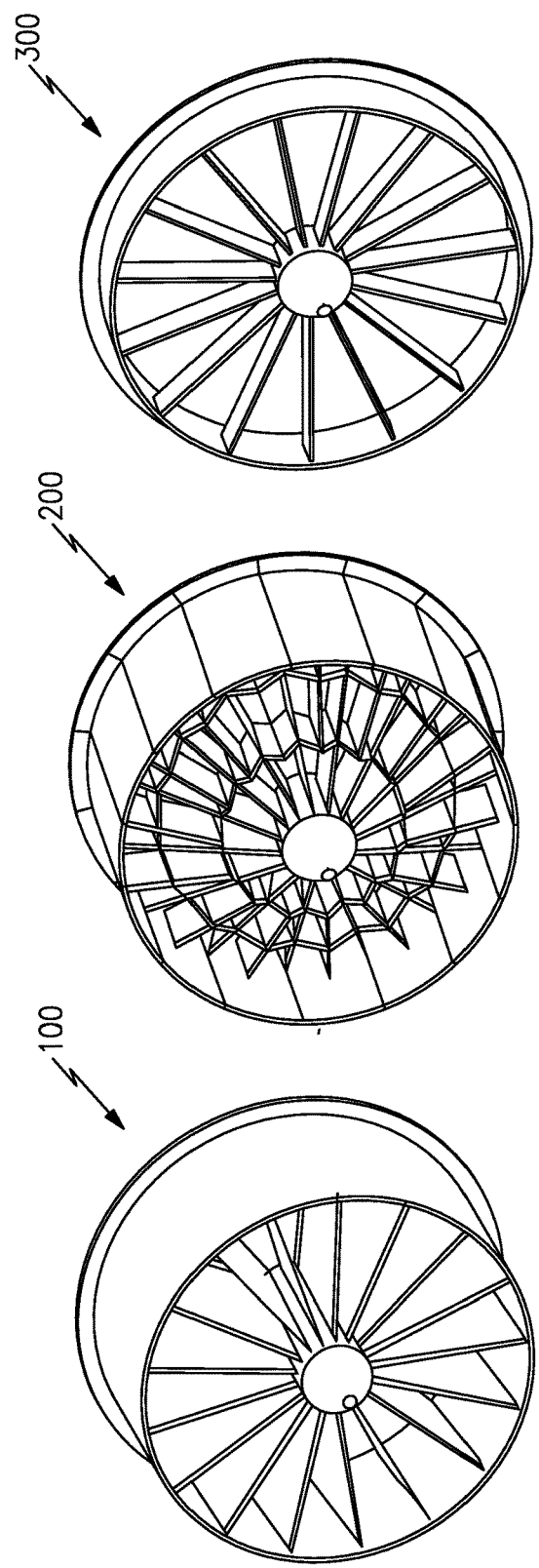

METHOD TO INTEGRATE MULTIPLE ELECTRIC CIRCUITS INTO ORGANIC MATRIX COMPOSITE

CROSS-REFERENCE TO RELATED APPLICATION

This application claims priority to U.S. Provisional Application No. 61/906,960, filed 21 Nov. 2013.

BACKGROUND OF THE INVENTION

Aircraft engines are often subjected to adverse weather conditions that can lead to ice forming on external surfaces of engine inlet components. One example of a heating system that is used to prevent ice from forming, or to remove existing ice, includes an electrical heating element that is applied to an individual component, such as a fairing or variable vane for example. Each individual component includes an electrical connector such that the electrical heating element can be connected to a power source. The individual components are then built into an assembly. However, when a more complicated part requires heating, such as parts having complex profiles where heaters would be required to span multiple zones or cells, using a dedicated heating system for each individual component is not practical or cost effective.

SUMMARY OF THE INVENTION

In a featured embodiment, a method of forming a circuit in a composite component includes providing a plurality of preform modules comprised of an organic matrix composite material, applying at least one electrical circuit on at least first and second preform modules of the plurality of preform modules, and arranging the first and second preform modules such that the electrical circuit of the first preform module is in contact with the electrical circuit of the second preform module. An additional step includes molding the first and second preform modules together to form a one-piece molded component such that the electrical circuits of the first and second preform modules form a complete circuit.

In another embodiment according to the previous embodiment, the electrical circuit comprises electrical conductive circuits and/or resistance heat circuits.

In another embodiment according to any of the previous embodiments, the electrical circuits include electrical traces or heater traces, and the arranging step includes placing traces on the first preform module in direct contact with traces on the second preform module.

In another embodiment according to any of the previous embodiments, the applying step further includes applying a plurality of electrical circuits on the first and second preform modules, and the arranging step further includes arranging each electrical circuit on the first and second preform modules to contact an electrical circuit on at least one adjacent preform module of the plurality of preform modules.

In another embodiment according to any of the previous embodiments, the preform modules are uncured modules.

In another embodiment according to any of the previous embodiments, the arranging step further includes arranging the plurality of preform modules within a mold, and including injecting resin into the mold subsequent to the arranging step.

In another embodiment according to any of the previous embodiments, including the step of connecting at least one electrical connector to one of the first and second electrical circuits to provide a connection interface to a power supply.

In another embodiment according to any of the previous embodiments, each preform module of the plurality of modules includes at least one electrical circuit, and wherein the arranging step further includes arranging the at least one electrical circuit of each preform module to be in direct contact with at least one electrical circuit on an adjacent preform module.

In another embodiment according to any of the previous embodiments, the method further includes the step of placing all of the plurality of preform arranged modules into a common mold prior to molding the modules together.

In another embodiment according to any of the previous embodiments, the complete circuit comprises a heating circuit that is selectively activated to heat the one-piece molded component.

In another embodiment according to any of the previous embodiments, the complete circuit comprises an electrical power circuit used to transfer electric power from one portion of the one-piece molded component to another portion of the one-piece molded component without having to use wiring.

In another embodiment according to any of the previous embodiments, the one-piece molded component comprises an aircraft component.

In another featured embodiment, a method of forming a circuit in composite component includes providing a plurality of preform modules, wherein a multitude of modules includes at least one electrical circuit portion applied to an external surface of the preform modules, and positioning the plurality of preform modules within a common mold such that the at least one electrical circuit portion of one of the preform modules is in direct contact with at least one electrical circuit portion on an adjacent preform module. An additional step includes molding the plurality of preform modules together to form a one-piece molded component such that the electrical circuit portions of the plurality of preform modules are permanently connected to form a complete circuit.

In another embodiment according to any of the previous embodiments, the plurality of preform modules are formed from an uncured organic matrix composite material.

In another embodiment according to any of the previous embodiments, the electrical circuit portions comprise electrical conductive circuits and/or resistance heat circuits.

In another embodiment according to any of the previous embodiments, the method further includes the step of connecting at least one electrical connector to one of the electrical circuit portions to provide a connection interface to a power supply.

In another embodiment according to any of the previous embodiments, the at least one electrical connector comprises a single electrical connector that is used to power the complete circuit.

In another embodiment according to any of the previous embodiments, the method further includes the step of dividing the complete circuit into a plurality of zones, and wherein the at least one electrical connector comprises a plurality of electrical connectors with at least one electrical connector being dedicated to each zone.

In another featured embodiment, a composite component includes a plurality of preform modules that are attached to each other via a molded interface to form a one-piece molded component. A multitude of the plurality of preform modules include at least one electrical circuit portion applied to an external surface of an associated preform module. The electrical circuit portion of one of the preform modules is in direct contact with the electrical circuit portion of an adjacent preform module such that electrical circuit portions on the preform modules are permanently connected together to form a complete circuit within the one-piece molded component.

In another embodiment according to any of the previous embodiments, the one-piece molded component comprises an aircraft component.

The foregoing features and elements may be combined in any combination without exclusivity, unless expressly indicated otherwise.

These and other features may be best understood from the following drawings and specification.

BRIEF DESCRIPTION OF THE DRAWINGS

FIG. 5 is a perspective view of one example of a component that is made from the apparatus of FIG. 4.

FIG. 6 is a perspective view of another example of a component that is made from the apparatus of FIG. 4.

FIG. 7 is a perspective view of another example of a component that is made from the apparatus of FIG. 4.

DETAILED DESCRIPTION

Figure 1:
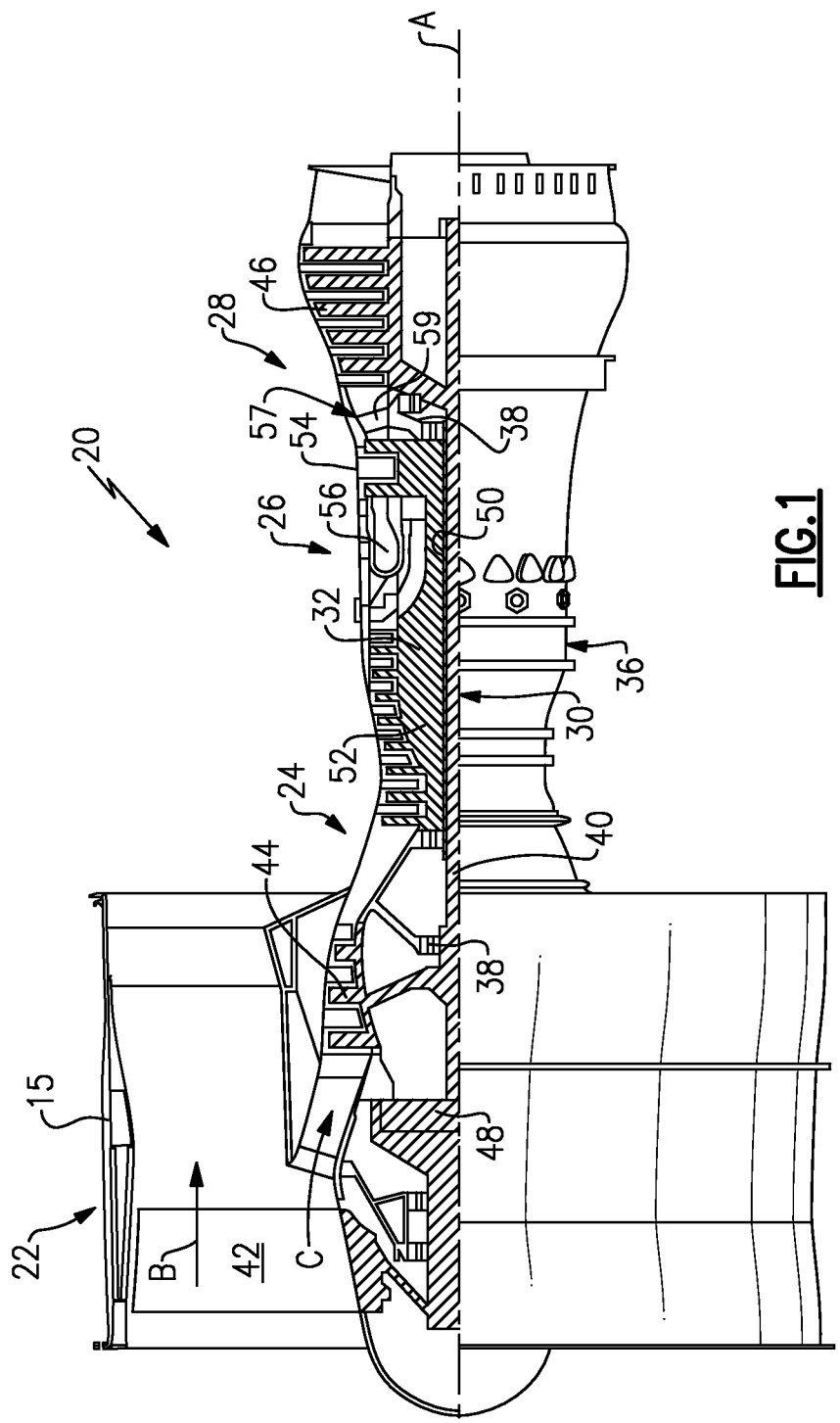
FIG. 1 is a schematic representation of one example of a gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flow path B in a bypass duct defined within a nacelle 15, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 57 of the engine static structure 36 is arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet. The flight condition of 0.8 Mach and 35,000 ft, with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(Tram\ °\ R)/(518.7°\ R)]^{0.5}$. The "Low corrected fan tip speed" as disclosed herein according to one non-limiting embodiment is less than about 1150 ft/second.

Many of the components used to form the high bypass ratio engine 20 shown in FIG. 1, or to form a low bypass ratio engine, such as those utilized in military applications for example, are complicated parts having complex shapes and/or profiles. Also, these components may require a heating system to remove ice, or to prevent ice formation under adverse weather conditions. Or, the components may need to provide electrical power transfer to various different areas of the component.

One method for forming such components for low or high bypass ratio engines comprises providing a plurality of preform modules that are placed within a molding apparatus to be molded together as a one-piece component. FIG. 1 shows an example of a first preform module 60 that is formed from an organic matrix composite (OMC) material. In this example the preform module 60 is formed to have a box-shape with bottom 62, top 64, and side walls 66 connecting the bottom wall 62 to the top wall 64. The module 60 has open ends and an open internal cavity 68. The module 60 is formed from a plurality of layers of organic matrix composite material to provide an OMC laminate preform that is uncured.

At least one electrical circuit portion 70 is attached to an external surface of one of the bottom 62, top 64, or side walls 66 of the module 60. In the example shown, the electrical circuit portions 70 are positioned near a fore or leading edge of the module; however, the electrical circuit portions could be located anywhere along the length of the module and can be located on any, or all, of the walls of the module. The electrical circuit portion 70 can comprise electrical conductive circuits and/or resistance heat circuits that include associated traces. These electric circuit portions 70 can be metallic, graphite, spray mat, etc. GKN Aerospace provides one example of a spray mat application for electrical circuits.

Figure 2:
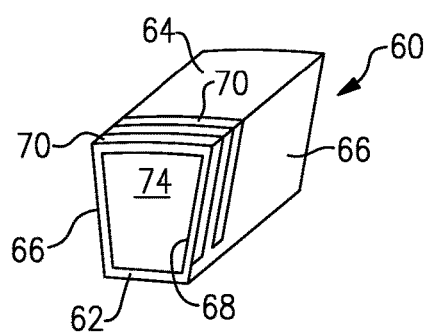
FIG. 2 is a perspective view of a first preform module with an electrical circuit portion.
Figure 3:
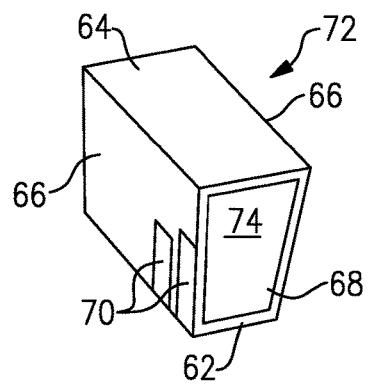
FIG. 3 is a perspective view of a second preform module with an electrical circuit portion.

In the example shown in FIG. 2, the first preform module 60 includes a plurality of circuit portions 70 that are on the top wall 64 and one of the side walls 66. FIG. 3 shows a second preform module 72 having electrical circuit portions 70 on the bottom 62 (FIG. 4) and side 66 walls. The first 60 and second 72 preform modules are supported by tooling mandrels 74 in their uncured state. Additional preform modules are formed to complete the desired part. The preform modules may each include one or more electrical circuit portions or some of the modules may not include any electrical circuit portions. However, the final component will be formed from a plurality of preform modules where many of the modules include circuit portions. Further, while the modules are discloses as having a box shape, it should be understood that the modules could have any of various different shapes. Additionally, the preform modules used to form the one-piece component may all have a common shape, or may be comprised of a plurality of different shapes.

Figure 4:
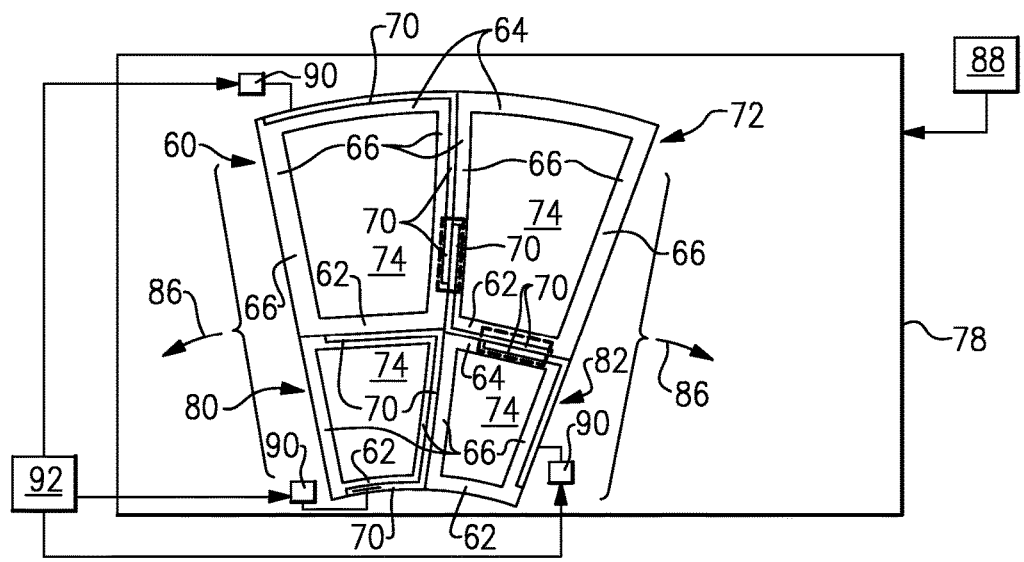
FIG. 4 is a schematic view of an arrangement of preform modules in a molding apparatus to form a one-piece molded component where the electric circuit portions of the preform modules are connected together to form a complete circuit.

FIG. 4 shows an example of a portion of the component to be made as positioned within a molding apparatus 78. It should be understood that the molding apparatus would also include other modules that would complete the component. As shown in FIG. 4, the first preform module 60 is placed adjacent to the second preform module 72 such that the electrical circuit portions 70 on the side wall 66 of the first preform module 60 are in direct contact with the electrical circuit portions on the side wall 66 of the second preform module 72. The tooling mandrels 74 facilitate holding the preform modules 60, 72 in place within the molding apparatus 78.

A third preform module 80 is positioned underneath the first preform module 60 and includes electrical circuit portions 70 on the top 64, bottom 62, and side walls 66. A fourth preform module 82 is positioned adjacent to the third preform module 80 and underneath the second preform module 72. The fourth perform module 82 includes electrical circuit portions 70 on the top 64 and side 66 walls. The electrical circuit portions 70 of the fourth perform 82 are in direct contact with the electrical circuit portions 70 of the second preform module 72 at an interface between the bottom wall 62 of the first preform module 60 and the top wall 64 of the fourth preform module 82. In this example, the third preform module 80 does not connect to the first 60 or fourth 82 preform module at the fore or leading edge of the component to be formed; however, these portions may connect to these modules at aft locations not visible from the front of FIG. 4.

Additional preform modules are loaded into the molding apparatus 78, as indicated at 86, until all of the modules required to form the desired component are correctly positioned. The tooling mandrels 74 hold the modules in their correct arrangement. The modules are arranged such that electrical circuit portions 70 are in direct contact with one or more electrical circuit portions 70 on adjacent modules.

Once all of the uncured preform modules are positioned within the molding apparatus 78, resin 88 is injected into the mold and the components are molded together to form a one-piece molded component. Various molding methods and/or molding apparatuses can be used to mold the modules together. Once the modules are molded together, the circuit portions on the various modules are connected to each other to form a permanently connected complete circuit. The circuit can continue through any number of modules.

The complete circuit can comprise a heating circuit that is selectively activated to heat one or more portions of the one-piece molded component. Or, the complete circuit can comprise an electrical power circuit used to transfer electric power from one portion of the one-piece molded component to another portion of the one-piece molded component without having to use wiring. For example, a highly conductive material, such as a copper spray, could be applied to the preform modules such that when the modules are molded together, contact between adjacent copper spray surfaces would allow an electrical power transfer across the component.

One example, method of forming a circuit in an aircraft engine component includes the following steps. A plurality of preform modules are provided where multiple modules include one or more electrical circuit portions applied to an external surface of the preform modules. The plurality of preform modules are positioned within a common mold such that the electrical circuit portions of one preform module are in direct contact with at least one electrical circuit portion on an adjacent preform module. The plurality of preform modules are then molded together to form a one-piece molded component such that the electrical circuit portions of the plurality of preform modules are permanently connected to form a complete circuit.

One or more electrical connectors 90 are connected to one of the electrical circuit portions 70 to provide a connection interface to a power supply 92. Any of various methods can be used to connect the electrical connectors 90 to the circuit. In one example, a single electrical connector 90 can be used to power the complete circuit. In another example, the complete circuit is divided into a plurality of zones and one or more electrical connectors 90 can be configured to be dedicated to each zone. As shown in FIG. 4, the electrical connectors 90 can be located at various locations on the component, such as an inner diameter location or an outer diameter location, for example.

While FIG. 1 shows various components for a high bypass ratio engine that can be formed as described above, FIGS. 5-7 show different examples of components for low ratio bypass engines that can be made by using the method described above. FIG. 5 shows that the one-piece molded component comprises a line-of-sight device 100. FIG. 6 shows that the one-piece molded component comprises a wave guide device 200. FIG. 7 shows that the one-piece molded component comprises a fan inlet case 300. LOS devices use axially long, curved struts to visually block the engine from incoming radar, while wave guide devices use multiple small cells (created by a complex series of intersecting struts and shrouds) to reduce an engine's radar signature. The subject invention could be used to provide multiple heater zones on these types of inlet devices as needed. The heating zones/heating elements would only be placed in areas that require ice protection. In the example of an LOS device, the heaters would preferably be located on a side of the strut that would be visible from a front of the aircraft.

By integrating heaters into the composite structure of an inlet device, the leading edge can be aerodynamically optimized while still providing ice protection capability. The controller and related equipment is greater reduced as compared to traditional de-icing systems. Use of the subject invention would give the inlet device the flexibility to be either engine or air frame mounted.

While FIGS. 5-7 show examples of inlet devices for low ratio bypass engines, other components in low bypass ratio engines having complex geometries could also be made using this method. Further, any component that requires electrical power transfer throughout the component can use this method to eliminate complications that arise with using traditional wiring methods. Examples of such components include fairings, fan cases, fan blades, fan exit guide vanes, etc.

Additionally, while the examples shown in FIGS. 1-6 depict various aircraft engine components, the subject invention could be used to form any type of aircraft composite component. Examples of other aircraft components that could be made according to the subject invention include aircraft wings, tail, fuselage, etc., and/or helicopter blades, rotors, fuselage, etc. Also, the subject invention could be utilized to make automotive parts or electronic components such as circuit boards, for example.

The subject invention allows multiple electrical circuits or heaters to be co-molded into complex geometries, reducing the need for secondarily bonded circuits or individual connectors for each sub-component. This provides for a very compact design and significantly decreases overall cost.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A method of forming a circuit in a composite component comprising the steps of:
   (a) providing a plurality of preform modules comprised of an organic matrix composite material;
   (b) applying at least one electrical circuit portion on at least a first preform module and at least one electrical circuit portion on at least a second preform module of the plurality of preform modules;
   (c) arranging the first and second preform modules such that the electrical circuit portion of the first preform module is in contact with the electrical circuit portion of the second preform module; and
   (d) molding the first and second preform modules together to form a one-piece molded component such that the electrical circuit portions of the first and second preform modules form a complete circuit.

2. The method according to claim 1 wherein the electrical circuit comprises electrical conductive circuits and/or resistance heat circuits.

3. The method according to claim 1 wherein the electrical circuits include electrical traces or heater traces and wherein step (c) includes placing traces on the first preform module in direct contact with traces on the second preform module.

4. The method according to claim 1 wherein step (b) includes applying a plurality of electrical circuits on the first and second preform modules, and step (c) includes arranging each electrical circuit on the first and second preform modules to contact an electrical circuit on at least one adjacent preform module of the plurality of preform modules.

5. A method of forming a circuit in a composite component comprising the steps of:
   (a) providing a plurality of preform modules comprised of an organic matrix composite material, wherein the plurality of preform modules are uncured modules;
   (b) applying at least one electrical circuit on at least first and second preform modules of the plurality of preform modules;
   (c) arranging the first and second preform modules such that the electrical circuit of the first preform module is in contact with the electrical circuit of the second preform module; and
   (d) molding the first and second preform modules together to form a one-piece molded component such that the electrical circuits of the first and second perform modules form a complete circuit.

6. The method according to claim 1 wherein step (c) includes arranging the plurality of preform modules within a mold, and including injecting resin into the mold subsequent to step (c).

7. The method according to claim 1 including connecting at least one electrical connector to one of the first and second electrical circuits to provide a connection interface to a power supply.

8. The method according to claim 1 where each preform module of the plurality of modules includes at least one electrical circuit, and wherein step (c) includes arranging the at least one electrical circuit of each preform module to be in direct contact with at least one electrical circuit on an adjacent preform module.

9. The method according to claim 8 including placing all of the plurality of preform modules arranged in step (c) into a common mold prior to step (d).

10. The method according to claim 1 wherein the complete circuit comprises a heating circuit that is selectively activated to heat the one-piece molded component.

11. The method according to claim 1 wherein the complete circuit comprises an electrical power circuit used to transfer electric power from one portion of the one-piece molded component to another portion of the one-piece molded component without having to use wiring.

12. The method according to claim 1 wherein the one-piece molded component comprises an aircraft component.

13. A method of forming a circuit in composite component comprising the steps of:
(a) providing a plurality of preform modules, wherein a multitude of modules includes at least one electrical circuit portion applied to an external surface of the preform modules;
(b) positioning the plurality of preform modules within a common mold such that the at least one electrical circuit portion of one of the preform modules is in direct contact with at least one electrical circuit portion on an adjacent preform module; and
(c) molding the plurality of preform modules together in the common mold to form a one-piece molded component such that the electrical circuit portions of the plurality of preform modules are permanently connected to form a complete circuit.

14. The method according to claim 13 wherein the plurality of preform modules of step (a) are formed from an uncured organic matrix composite material.

15. The method according to claim 14 wherein the electrical circuit portions comprise electrical conductive circuits and/or resistance heat circuits.

16. The method according to claim 14 including connecting at least one electrical connector to one of the electrical circuit portions to provide a connection interface to a power supply.

17. The method according to claim 16 wherein the at least one electrical connector comprises a single electrical connector that is used to power the complete circuit.

18. The method according to claim 16 including dividing the complete circuit into a plurality of zones, and wherein the at least one electrical connector comprises a plurality of electrical connectors with at least one electrical connector being dedicated to each zone.

19. A composite component comprising:
a plurality of preform modules that are attached to each other via a molded interface to form a one-piece molded component, and wherein a multitude of the plurality of preform modules include at least one electrical circuit portion applied to an external surface of an associated preform module, and wherein the electrical circuit portion of one of the preform modules is in direct contact with the electrical circuit portion of an adjacent preform module such that electrical circuit portions on the preform modules are permanently connected together to form a complete circuit within the one-piece molded component.

20. The composite component according to claim 19 wherein the one-piece molded component comprises an aircraft component.

21. The method according to claim 1 wherein step (c) includes arranging the first and second preform modules in a molding apparatus such that the electrical circuit portion of the first preform module is in contact with the electrical circuit portion of the second preform module; and wherein step (d) includes molding the first and second preform modules together within the molding apparatus to form the one-piece molded component.

22. The method according to claim 21 wherein step (c) includes using mandrels to hold each preform module in the molding apparatus in a correct arrangement to form a desired shape for the one-piece molded component, and including injecting resin into the molding apparatus subsequent to step (c).

* * * * *